United States Patent [19]

Yamamoto et al.

[11] Patent Number: 5,399,648
[45] Date of Patent: Mar. 21, 1995

[54] HIGH-PURITY SILICONE LADDER POLYMER AND PROCESS PRODUCING THE SAME

[75] Inventors: Shigeyuki Yamamoto; Hiroshi Adachi, both of Hyogo, Japan

[73] Assignee: Mitsubishi Denki Kabushiki Kaisha, Tokyo, Japan

[21] Appl. No.: 110,367

[22] Filed: Aug. 23, 1993

[30] Foreign Application Priority Data

Dec. 21, 1992 [JP] Japan .................................. 4-340638
Dec. 28, 1992 [JP] Japan .................................. 4-347716
Mar. 31, 1993 [JP] Japan .................................. 5-074171

[51] Int. Cl.⁶ .............................................. C08G 77/06
[52] U.S. Cl. .......................................... 528/12; 528/14
[58] Field of Search .................................... 528/12, 14

[56] References Cited

U.S. PATENT DOCUMENTS

| | | |
|---|---|---|
| 5,023,204 | 6/1991 | Mitsubishi . |
| 5,057,336 | 10/1991 | Adachi et al. ................ 525/447 |
| 5,081,202 | 1/1992 | Adachi et al. ................ 528/43 |
| 5,087,553 | 2/1992 | Mitsubishi . |
| 5,180,691 | 1/1993 | Adachi et al. ................ 437/219 |
| 5,236,984 | 8/1993 | Yamamoto et al. ........... 528/21 |

FOREIGN PATENT DOCUMENTS 50-111197 9/1975 Japan .
57-18729 1/1982 Japan .
56-125855 10/1991 Japan .

OTHER PUBLICATIONS

Japanese Patent Public Disclosure No. 3-207719, published Sep. 11, 1991.

*Primary Examiner*—Melvyn I. Marquis
*Attorney, Agent, or Firm*—Wolf, Greenfield & Sacks

[57] ABSTRACT

High-purity silicone ladder polymer a weight average molecular weight of 600–1,000,000 and a molecular weight distribution of no more than 10 and it contains no more than 1 ppm each of sodium, potassium, iron, copper, lead and chlorine and no more than 1 ppb each of uranium and thorium. This silicone ladder polymer is very pure, has high molecular weight and yet can be produced easily. Hence, it can advantageously be used as a material for making surface protective or inter-level insulation films in semiconductor devices.

16 Claims, No Drawings

HIGH-PURITY SILICONE LADDER POLYMER AND PROCESS PRODUCING THE SAME

BACKGROUND OF THE INVENTION

This invention relates to a high-purity silicone ladder polymer having lower alkyl groups in side chains, as well as a process for producing said polymer. More particularly, this invention relates to silicone ladder polymer that can advantageously be used as a material for making protective films, inter-level insulation films, etc. in semiconductor and other electronic devices. The invention also relates to a process for producing such high-purity silicone ladder polymer.

Because of their unique molecular structure, silicone ladder polymers excel in heat resistance, electrical insulating properties, chemical resistance and anti-aging property and they have conventionally been used as materials for making protective films and inter-level insulation films in electronic parts or semiconductor devices, etc.

Conventional processes for producing such silicone ladder polymers are described in Reference 1 (Japanese Patent Public Disclosure No. Hei 3-20331) and Reference 2 (Japanese Patent Public Disclosure No. Hei 2-107638). Silicone ladder polymers have a structure represented by the following formula and are characterized by ladder bonds:

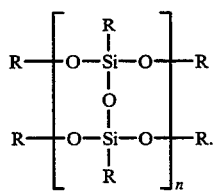

The process described in Reference 1 for producing the silicone ladder polymer of interest starts with reacting an organotriacetoxysilane with an equivalent amount of alcohol or water in an organic solvent to prepare an alkoxyacetoxysilane. Then, the resulting alkoxyacetoxysilane is polycondensed in an organic solvent in the presence of sodium hydrogencarbonate to give a prepolymer. Subsequently, the prepolymer is thermally polycondensed in the presence of a catalyst such as an alkali metal oxide or an alkaline earth metal hydroxide or a fluoride thereof or triethylamine to yield a polyorganosilsesoxane which is a silicone "ladder" polymer resin.

The process described in Reference 2 comprises dispersing a catalyst in a prepolymer of ladder-type organopolysiloxane and polycondensing the dispersion by uniform heating under exposure to microwaves, whereby the intended organopolysiloxane of a ladder type is produced. The catalyst used in this process is selected from among alkali metal hydroxides and metal fluorides.

The silicone ladder polymers produced by these conventional methods have had the problem that they contain large amounts of impurities or by-products. This is because the conditions for preparing the prepolymer are not controlled in such a way as to produce a ladder-type polymer and, hence, by-products such as linear or cyclic condensation polymers are prone to occur, increasing the chance of gelation to take place when the prepolymer is polymerized to a polymer of a higher molecular weight. This is why the silicone ladder polymers produced by the methods of References 1 and 2 contain large amounts of impurities and by-products.

If the method of polymerization described in Reference 1 is conducted at high concentration, the chance of the formation of the by-products exemplified above increases and they will remain in large amounts in the silicone ladder polymer produced. Such residual by-products are very difficult to remove.

To implement the method described in Reference 2, the catalyst must be dispersed uniformly in the prepolymer but this results in using the catalyst in an increased amount. The catalyst is an impurity to the silicone ladder polymer to be produced and if the method described in Reference 2 is employed, the silicone ladder polymer will be produced under such conditions that the catalyst is difficult to remove. Hence, the silicone ladder polymer produced by the method of Reference 2 contains a large amount of impurity catalyst, which is also very difficult to remove.

Another problem with the prior art methods is that it is difficult to produce silicone ladder polymers of higher molecular weight. In order to increase the molecular weight of the silicone ladder polymers to be produced by the conventional methods, polycondensation of the prepolymer must be carried out at high concentration but this increases the chance of its gelation for the reason already mentioned above. Hence, the maximum weight average molecular weight that could be attained was only on the order of $10^4$ and it has been impossible to produce silicone ladder polymers having weight average molecular weights in excess of 100,000. Furthermore, the molecular weight distribution (weight average molecular weight divided by number average molecular weight) of the silicone ladder polymers that are produced by the conventional methods is so wide (100 or more) that if one attempts to form a predetermined pattern in a film of the polymer using a solvent, the cross-sectional profile of the pattern will deteriorate. Hence, it has been difficult to form this films from the silicone ladder polymers produced by the conventional methods.

SUMMARY OF THE INVENTION

The present invention has been accomplished under these circumstances and has as an object synthesizing a silicone ladder polymer that contains smaller amounts of impurities or by-products and which yet is available in a higher molecular weight than has been possible by the prior art.

To attain this object, the present inventors conducted intensive studies and found that a high-purity silicone ladder prepolymer of the general formula (I):

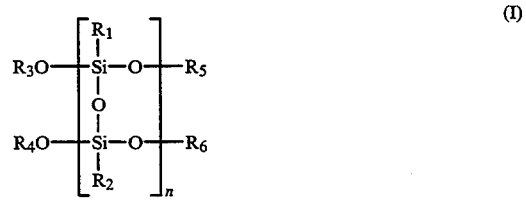

(where $R_1$, $R_2$, $R_3$, $R_4$, $R_5$ and $R_6$ represent the same or different lower alkyl groups) by dissolving a starting compound of the general formula (II):

(where $R_7$, $R_8$, $R_9$ and $R_{10}$ represent the same or different lower alkyl groups) in an organic solvent, adding dropwise hydrogen chloride containing ultrapure water under cooling to initiate hydrolysis, and washing the resulting product with ultrapure water to neutralize the washed product.

The present inventors also found that a high-purity silicone ladder prepolymer of the general formula:

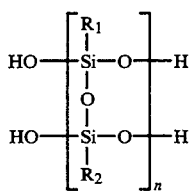

(where $R_1$ and $R_2$ represent the same or different lower alkyl groups; and n represents a natural number corresponding to a weight average molecular weight of 600 to less than 30,000) by adding ultrapure water dropwise to a solution in an organic solvent of a starting compound of the general formula (III):

$$R_{11}SiCl_3 \qquad (III),$$

(where $R_{11}$ is a lower alkyl group), performing hydrolysis under cooling, and washing the resulting hydrolyzate with ultrapure water to remove hydrogen chloride.

The present inventors further found that starting with the above-described high-purity silicone ladder prepolymer, a high-purity silicone polymer of high molecular weight with a molecular weight distribution of no more than 10 could be produced by the following process: a nucleophilic reagent is added to a solution of the starting prepolymer in a small amount insufficient to cause gelation; then, a dehydrative condensation reaction is performed under stirring to increase the molecular weight of the prepolymer; after the end of the reaction, the resulting reaction solution is added dropwise to an alcohol of high purity, say an electronic-grade alcohol, whereby the reaction product is recovered as a precipitate.

Both the silicone ladder prepolymer and the silicone ladder polymer of high molecular weight are very low in the contents of sodium, potassium, iron, copper, lead, chlorine, uranium and thorium, have a higher purity than has ever been possible by the prior art methods, and are capable of forming thick enough films to be used advantageously as protective films, inter-level insulation films, etc. in semiconductor devices. Furthermore, the patterns formed with the aid of solvents provide a satisfactory cross-sectional profile.

To avoid confusion, three different expressions will be used throughout the specification to denote various polymers: polymers having weight average molecular weights of 600–30,000 are collectively referred to by the simple term "silicone ladder polymer"; polymers having weight average molecular weights of 600 to less than 30,000 are named "silicone ladder prepolymer"; and those polymers which have weight average molecular weights of 30,000 and above are specifically referred to as "silicone ladder polymers of high molecular weight".

Thus, the present invention provides a high-purity silicone ladder polymer that contains no more than 1 ppm each of sodium, potassium, iron, copper, lead and chlorine and no more than 1 ppb each of uranium and thorium, that is represented by the general formula (I):

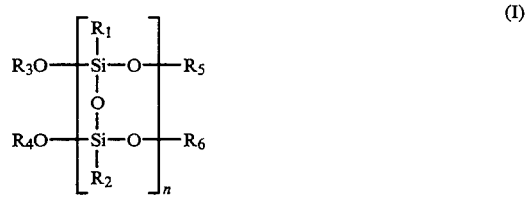

(where $R_1$ and $R_2$ represent the same or different lower alkyl groups; $R_3$, $R_4$, $R_5$ and $R_6$ each represent a hydrogen atom or a lower alkyl group; and n is a natural number corresponding to a weight average molecular weight of 600–1,000,000), and that has a molecular weight distribution of no more than 10.

The present invention also provides a process for producing a high-purity silicone ladder prepolymer that has a terminal alkoxy group and a molecular weight distribution of no more than 10, that contains no more than 1 ppm each of sodium, potassium, iron, copper, lead and chlorine and no more than 1 ppb each of uranium and thorium, and that is represented by the general formula (I):

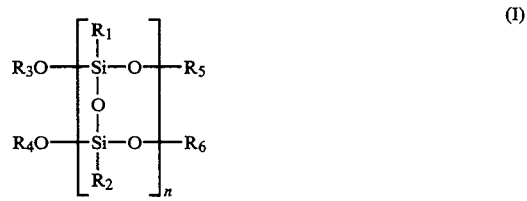

(where $R_1$ and $R_2$ represent the same or different lower alkyl groups; $R_3$, $R_4$, $R_5$ and $R_6$ represent a hydrogen atom or a lower alkyl group; and n is a natural number corresponding to a weight average molecular weight of 600 to less than 30,000) [said prepolymer is hereunder referred to as a high-purity silicone ladder prepolymer (a)], which process comprises dissolving an organotrialkoxysilane compound of the general formula (II):

$$R_7SiOR_8OR_9OR_{10}$$

(where $R_7$, $R_8$, $R_9$ and $R_{10}$ each represent a lower alkyl group) in an organic solvent, hydrolyzing said compound with hydrogen chloride containing ultrapure water under cooling, and then washing the resulting hydrolyzate with ultrapure water.

The present invention also provides a process for producing a high-purity silicone ladder prepolymer that has a terminal hydroxyl group and a molecular weight distribution of no more than 10, that contains no more than 1 ppm each of sodium, potassium, iron, copper, lead and chlorine and no more than 1 ppb each of uranium and thorium, and that is represented by the general formula (I):

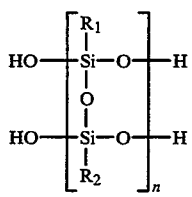

(where $R_1$ and $R_2$ represent the same or different lower alkyl groups; and n is a natural number corresponding to a weight average molecular weight of 600 to less than 30,000) [said prepolymer is hereunder referred to as a high-purity silicone ladder prepolymer (b)], which process comprises dissolving an organotrichlorosilane compound of the general formula (III):

$$R_{11}SiCl_3$$

(where $R_{11}$ represents a lower alkyl group) in an organic solvent, hydrolyzing said compound with ultrapure water under cooling, and then washing the resulting hydrolyzate with ultrapure water.

The present invention further provides a process for producing a high-purity silicone ladder polymer of high molecular weight that contains no more than 1 ppm each of sodium, potassium, iron, copper, lead and chlorine and no more than 1 ppb each of uranium and thorium, that is represented by the general formula (I) and that has a weight average molecular weight of 30,000–1,000,000, which process comprises dissolving the high-purity silicone ladder prepolymer (a) or (b) in an organic solvent to form a solution, then adding a nucleophilic reagent to said solution to initiate dehydrative condensation to yield a product having a higher molecular weight, and purifying said product by a dissolution/reprecipitation method.

DETAILED DESCRIPTION OF THE INVENTION:

The present invention is described below in detail.

The high-purity silicone ladder polymer of the present invention contains no more than 1 ppm each of sodium, potassium iron, copper, lead and chlorine and no more than 1 ppb each of uranium and thorium, and is represented by the general formula (I):

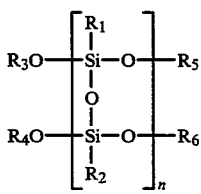

(where $R_1$ and $R_2$ represent the same or different lower alkyl groups; $R_3$, $R_4$, $R_5$ and $R_6$ each represent a hydrogen atom or a lower alkyl group; and n is a natural number corresponding to a weight average molecular weight of 600–1,000,000)

Preparation of High-Purity Silicone Ladder Prepolymers (a) and (b)

High-purity silicone ladder prepolymer (a) is produced starting from an organotrialkoxysilane of the general formula (II):

$$R_7SiOR_8OR_9OR_{10}$$

(where $R_7$, $R_8$, $R_9$ and $R_{10}$ represent the same of different lower alkyl groups). The organotrialkoxysilane compound is preferably one that is already purified by distillation in a nitrogen stream under vacuum. This starting organotrialkoxysilane compound has low reactivity with moisture and is not likely to change upon standing in the atmosphere; however, it is also characterized by low likelihood for hydrolysis and polycondensation.

The organotrialkoxysilane that can be used in the present invention is exemplified by, but not limited to, methyltrimethoxysilane, methyltriethoxysilane, methyltripropoxysilane, ethyltrimethoxysilane, ethyltriethoxysilane, ethyltripropoxysilane, n-propyltrimethoxysilane, n-propyltriethoxysilane and n-propyltripropoxysilane.

High-purity silicone ladder prepolymer (b) having a terminal hydroxyl group is produced starting from an organotrichlorosilane compound of the general formula (III):

$$R_{11}SiCl_3 \quad \text{(III)}$$

(where $R_{11}$ is a lower alkyl group). The organotrichlorosilane compound is preferably one that is already purified by distillation in a nitrogen stream under vacuum. The purified organotrichlorosilane compound will readily hydrolyze in the presence of atmospheric moisture, thereby generating hydrogen chloride to become an organo-$SiO_{1.5}$ unit structure. Hence, it is recommended to handle this organotrichlorosilane compound with care being taken to avoid contact with moisture containing air. The organotrichlorosilane of the general formula (III) is exemplified by, but not limited to, methyltrichlorosilane, ethyltrichlorosilane and n-propyltrichlorosilane.

In the first step of the process for preparing high-purity silicone ladder prepolymer (a) or (b), the organotrialkoxysilane represented by the general formula (II) or the organotrichlorosilane compound of the general formula (III) is dissolved in an organic solvent. The concentration of the solution is preferably adjusted in such a way that the concentration of either high-purity silicone ladder prepolymer to be obtained in an organic solvent solution is typically in the range from 0.05 to 0.3 g/ml. If the concentration of the silicone ladder prepolymer is less than 0.05 g/ml, the rate of polymerization reaction is very slow and, furthermore, the high-purity silicone ladder prepolymer prepared has such a low molecular weight that after quenching the reaction, a solution of the washed hydrolyzate in an organic solvent will not readily separate into the organic layer and the aqueous layer. If the concentration of the silicone ladder prepolymer exceeds 0.3 g/ml, the heat generated during hydrolysis of the silicone rubber prepolymer will not be effectively dissipated, whereby a partial change occurs in the polymerization rate and, at the same time, irregular structures are prone to be introduced into the high-purity silicone ladder prepolymer, which is by no means preferred for the purposes of the present invention.

The organic solvent in which the organotrialkoxysilane or organotrichlorosilane compound is to be dissolved may be selected from among nonaqueous organic solvents that can dissolve the hydrolyzate. Specific examples of such organic solvents include: ketones such as methyl isobutyl ketone and methyl ethyl ketone; ethers such as diethyl ether and isopropyl ether; and aromatic hydrocarbons such as xylene, toluene and benzene. Among these compounds, electronic-grade chemicals of high purity are preferred and it is also preferred to use them either individually or in admixtures.

When preparing the high-purity silicone ladder prepolymer (a), ultrapure water that contains hydrogen chloride is added dropwise. To this end, the concentration of hydrogen chloride is adjusted to lie within the range 0.02–0.23 mole per mole of the starting organotrialkoxysilane. The hydrogen chloride to be used is preferably electronic-grade. The term "ultrapure water" as used herein means water from which impurities have been removed as much as possible and which has a specific resistance of 16 M$\Omega$·cm or above.

Hydrogen chloride acts as a catalyst for chemical reaction in which the organotrialkoxysilane is transformed to the high-purity silicone ladder prepolymer having a ladder structure. If the concentration of the catalyst is less than 0.02 mole per mole of the organotrialkoxysilane, its effectiveness as the catalyst is low enough to reduce the reaction rate. If the catalyst concentration exceeds 0.23 mole, not only is it impossible for the catalyst to exhibit the intended effect that is commensurate with the amount of its addition but it also has the tendency to impede the progress of the reaction.

When preparing the high-purity silicone ladder prepolymer (b), the organotrichlorosilane compound represented by the general formula (III) is dissolved in an organic solvent and ultrapure water is then added dropwise to the resulting solution under cooling. Ultrapure water which may or may not contain hydrogen chloride is preferably added in an amount of 1.0–20 moles per mole of the starting compound.

When cooling the solution in organic solvent in the process of preparing the high-purity silicone ladder prepolymer (a) or (b), the temperature of the solution is preferably adjusted to between −20° C. and 30° C., more preferably between −15° C. and 25° C. Below −20° C., the aqueous hydrogen chloride or ultrapure water added dropwise will solidify to prevent the effective progress of hydrolysis. Above 30° C., the evaporation of the hydrogen chloride added is accelerated and hydrolysis will not proceed rapidly enough. After the dropwise addition of ultrapure water ends, stirring is preferably continued for an additional 2–5 h in order to bring the hydrolytic reaction to completion.

After the end of the reaction, the reaction solution is separated into two phases, one being the organic solvent layer and the other being the aqueous layer.

In the next step, the lower aqueous layer is removed by a suitable means such as a separating funnel and the organic solvent layer which contains the high-purity silicone ladder prepolymer is recovered. The recovered organic solvent layer is then washed with ultrapure water. Washing with ultrapure water in the present invention may be implemented by various known methods. To give an example, the organic solvent layer is mixed with an equal volume of ultrapure water, the mixture is stirred or shaken by a suitable means such as a separating funnel and, thereafter, the lower aqueous layer is removed whereas the organic solvent layer is recovered. If this procedure is repeated three times or more, not only sodium and potassium ions but also other impurities such as chloride ion which occurs in a large amount can readily be removed from the high-purity silicone ladder prepolymer. These impurities would be removed because the high-purity silicone ladder prepolymer prepared has a ladder structure that serves as a substantial barrier against the incorporation of impurities into the molecule.

The silicone ladder prepolymer under discussion has such a low molecular weight that it cannot be recovered by the usual precipitation technique which employs an appropriate combination of good and poor solvents; alternatively, it is preferred to distill off the solvent so that the prepolymer is evaporated to sufficient dryness to permit its recovery as a powder.

In the manner described above, there is recovered the high-purity silicone ladder prepolymer that contains no more than 1 ppm each of sodium, potassium, iron, copper, lead and chlorine and no more than 1 ppb each of uranium and thorium, that has a weight average molecular weight of 600 to less than 30,000 and a molecular weight distribution of no more than 10, and which is represented by the general formula (I).

Preparation of the High-Purity Silicone Ladder Polymer of High Molecular Weight

The high-purity silicone ladder polymer of high molecular weight that is represented by the general formula (I) and which has a weight average molecular weight of 30,000–1,000,000 is produced by the following procedure: the solution of the high-purity silicone ladder prepolymer in organic solvent that has been neutralized by washing or, in the case where the high-purity silicone ladder prepolymer is recovered as a powder, a solution of that prepolymer as dissolved in an organic solvent, is transferred into a quartz glass flash equipped with a Teflon stirring rod, a reflux condenser and a Dean-Stark trap; then, a nucleophilic reagent is put into the flask and the mixture is heated to initiate dehydrative condensation; the resulting product of an increased molecular weight is purified by a dissolution/reprecipitation method.

The organic solvent to be used in the case where the high-purity silicone ladder prepolymer is recovered as a powder may be selected from among nonaqueous organic solvents that can dissolve the high-purity silicone ladder prepolymer. Specific examples of such organic solvents include: ketones such as methyl isobutyl ketone and methyl ethyl ketone; ethers such as diethyl ether and isopropyl ether; and aromatic hydrocarbons such as xylene, toluene and benzene. Among these compounds, electronic-grade chemicals of high purity are preferred and it is also preferred to use them either individually or in admixtures.

The nucleophilic reagent means a reagent that enters into a nucleophilic reaction with another molecule by attacking a site of low electron density, namely, by sharing electrons with the molecule with which it is to react. The nucleophilic reagent may be exemplified by hydroxides of elements such as K, Na and Cs. Preferably, electronic-grade potassium hydroxide, sodium hydroxide, etc. are used. The nucleophilic reagent is preferably used in an amount of 0.01–5 wt %, more preferably 0.05–3 wt %, of the high-purity silicone ladder prepolymer. If less than 0.01 wt % of the nucleophilic reagent is used, the catalyst activity is reduced to lower the rate of reaction involving the high-purity ladder prepolymer. If more than 5 wt % of the nucleophilic reagent is used, the dissociation of siloxane bonds that form in the presence of the reagent will proceed preferentially, which is a condition not favorable for the purpose of increasing the molecular weight.

Then, the high-purity silicone ladder prepolymer is subjected to dehydrative condensation under heating in the organic solvent layer to which the nucleophilic reagent has been added. The heating temperature is preferably in the range 40°–250° C., more preferably in the range of 50°–200° C. Below 40° C., the reaction will sometimes fail to progress. Above 250° C., partial acceleration of polymerization may take place, which is not preferred for the purposes of the present invention. The heating time is preferably at least 1 h. If the heating time is shorter than 1 h, the reaction will sometimes fall to progress.

Thus, the silicone ladder polymer of high molecular weight that is represented by the general formula (I) and that has a weight average molecular weight of 30,000–1,000,000 and a molecular weight distribution of no more than 10 is obtained in the organic solvent. The weight average molecular weight of this silicone ladder polymer of high molecular weight can be adjusted as appropriate by selecting the types of solvent and catalyst, the amount of their use and the time of condensation reaction.

Since the silicone ladder polymer of high molecular weight thus produced contains the nucleophilic reagent as an impurity no matter how small it may be, the polymer is subsequently purified by a dissolution/reprecipitation method. The term "dissolution/reprecipitation method" as used herein means a method of purification in which the impurity-containing substance is dissolved in a good solvent and the resulting solution is gradually added in drops to a poor solvent to cause reprecipitation.

An ether-base solvent can advantageously be used as a good solvent in the present invention. A typical example of the good solvent is tetrahydrofuran. It is preferred to use a good solvent that has already been distilled, followed by filtration through a filter having a pore size of 0.5 μm. The good solvent is added to tile reaction solution containing the silicone ladder polymer of high molecular weight in such an amount that the concentration of said polymer is within the range 2–15 wt %. If the concentration of the polymer is less than 2 wt %, it will not readily reprecipitate and hence is difficult to purify. Beyond 15 wt %, the concentration of the polymer is so high that the chance of the nucleophilic reagent of being trapped between molecules of the polymer increases, making it rather difficult for the polymer to be purified by reprecipitation.

In the next step, the reaction solution containing the silicone ladder polymer of high molecular weight to which the good solvent has been added is gradually added in drops to a poor solvent. An alcoholic solvent can advantageously be used as the poor solvent in the present invention. A typical example of the poor solvent is methyl alcohol. It is desired to use poor solvents of high purity, preferably electronic-grade ones. The poor solvent is preferably added in 5–20 times the volume of the reaction solution. If the volume of the poor solvent is less than 5 times the volume of the reaction solution, it is difficult to remove impurity ions. If the volume of the poor solvent exceeds 20 times the volume of the reaction solution, the solvent is simply wasted. The good solvent is gradually added in drops in order to achieve efficient removal of impurity ions.

The silicone ladder polymer that has been thus recovered by precipitation through addition to the poor solvent is further dissolved in the good solvent as above and then added dropwise to the poor solvent, whereby the polymer is again recovered as a precipitate. If this procedure of purification is repeated 3–5 times, the content of the nucleophilic reagent is reduced to 1 ppm and less.

When the thus obtained high-purity silicone ladder polymer of high molecular weight is analyzed by infrared spectrophotometry, a clear double peak showing a siloxane bond is observed at near 1100 cm$^{-1}$ but no single peak is observed at 1100 cm$^{-1}$. The clear peak at near 1100 cm$^{-1}$ consists of two peaks at 1135 cm$^{-1}$ and 1045 cm$^{-1}$, respectively, and this is an absorption peak assignable to the asymmetric stretching vibration of Si—O—Si, showing the ladder type linkage of siloxane. On the other hand, a single peak at 1100 cm$^{-1}$ is an absorption peak assignable to the asymmetric stretching vibration of a linear Si—O—Si structure which has no ladder structure. It can therefore be verified that almost all siloxane bonds in the silicone ladder polymer of high molecular weight which has been produced in accordance with the present invention have a ladder structure. Furthermore, absorption peaks assignable to lower alkyl groups are observed at 2800–3200 cm$^{-1}$. These data demonstrate the identity of the polymer of interest as a silicone ladder polymer.

Thus, the high-purity silicone ladder polymer of high molecular weight is produced that contains no more than 1 ppm each of sodium, potassium, iron, copper, lead and chlorine and no more than 1 ppb each of uranium and thorium, that has a weight average molecular weight of 30,000–1,000,000 and a molecular weight distribution of no more than 10, and that is represented by the general formula (I).

The high-purity silicone ladder prepolymer and the high-purity silicone ladder polymer of high molecular weight that are each represented by the general formula (I) have a ladder structure composed of siloxane bonds in the backbone and, hence, they are rigid enough to exhibit high heat resistance. Another feature is of the prepolymer and the polymer of high molecular weight is that they contain no more than 1 ppm each of sodium, potassium, iron, copper, lead and chlorine and no more than 1 ppb each of uranium and thorium. Because of this highly pure nature, they can advantageously be used as materials for the formation of protective films, inter-level insulation films, etc. in semiconductor devices.

The following examples are provided for the purpose of further illustrating the high-purity silicone ladder prepolymer and high-molecular weight silicone ladder polymer of the present invention, as well as the processes for their preparation. It should, however, be noted that those examples are in no way to be taken as limiting the present invention.

EXAMPLES 1–7

The various organotrialkoxysilanes listed in Table 1 were used as starting materials after being distilled under vacuum in a nitrogen stream. These organotrialkoxysilanes and the electronic-grade solvents also listed in Table 1 were mixed in the proportions listed in Table 1 to prepare solutions. Each of the solutions was transferred into a four-neck flash having a capacity of 2 liters that was equipped with a dripping funnel, a thermometer and a stirring rod; the solutions were then cooled at the hydrolysis temperatures listed in Table 1.

A catalyst was gradually added dropwise in the amounts listed in Table 1 under the cooling and stirring conditions described above. The resulting heat generation was not very vigorous and the addition was continued for 1-2 h. After the end of the addition, the reaction mixture was stirred for an additional 3 h so as to bring the hydrolytic reaction to completion. Subsequently, the solution of silicone ladder prepolymer was separated into two phases. The lower aqueous layer was removed and the organic layer containing the silicone ladder prepolymer was recovered. An equal volume of ultrapure water was added to the organic layer for washing the latter under shaking. The same procedure was repeated 5 times. The washed silicone ladder prepolymer was analyzed for various impurity contents by an ion chromatographic analyzer (IC-500 of Yokogawa-Hokushin Electric Co., Ltd.); in each of Examples 1-7, the content of chloride ions in the silicone ladder prepolymer was ca. 1,000 ppm after the first washing and it was 1 ppm and less in the third and subsequent washing cycles; the concentration of potassium ions also decreased as the number of washing cycles increased and it was 1 ppm and below in the third and subsequent washing cycles.

respective silicone ladder prepolymers after three washing cycles are also shown in Table 2, from which one can see that the content of each of sodium, potassium iron, copper, lead and chlorine was 1 ppm or less whereas the content of each of uranium and thorium was 1 ppb or less.

The structures of the respective silicone ladder prepolymers produced in Examples 1-7 were examined by infrared spectrophotometry (using FT/IR-111 of JOEL, Ltd.); since a double peak for siloxane bond was observed at near 1100 cm$^{-1}$ (see Journal of Polymer Science, Vol. C-1, p.83), each of the silicone ladder prepolymers tested was verified to have the structure represented by the general formula (I).

TABLE 2

| | Concentration in solvent | Weight average molecular weight | Impurity content | | | | | | | |
|---|---|---|---|---|---|---|---|---|---|---|
| | | | ppm | | | | | | ppb | |
| Ex. | g/ml | | Na | K | Cl | Fe | Cu | Pb | U | Th |
| 1 | 0.1 | 12500 | 0.98 | 0.89 | 0.48 | ≦0.80 | ≦0.80 | ≦0.80 | ≦1.0 | ≦1.0 |
| 2 | 0.1 | 13000 | 0.91 | 0.83 | 0.51 | ≦0.80 | ≦0.80 | ≦0.80 | ≦1.0 | ≦1.0 |
| 3 | 0.08 | 9500 | 0.87 | 0.79 | 0.53 | ≦0.80 | ≦0.80 | ≦0.80 | ≦1.0 | ≦1.0 |
| 4 | 0.2 | 18000 | 0.67 | 0.73 | 0.46 | ≦0.80 | ≦0.80 | ≦0.80 | ≦1.0 | ≦1.0 |
| 5 | 0.05 | 7800 | 0.82 | 0.90 | 0.47 | ≦0.80 | ≦0.80 | ≦0.80 | ≦1.0 | ≦1.0 |
| 6 | 0.08 | 10500 | 0.76 | 0.81 | 0.50 | ≦0.80 | ≦0.80 | ≦0.80 | ≦1.0 | ≦1.0 |
| 7 | 0.12 | 14800 | 0.95 | 0.96 | 0.47 | ≦0.80 | ≦0.80 | ≦0.80 | ≦1.0 | ≦1.0 |

COMPARATIVE EXAMPLES 1-4

The organotrialkoxysilanes listed in Table 3 were hydrolyzed as in Examples 1-7 except that the proportion of mixing the starting organotrialkoxysilanes with electronic-grade solvents and the hydrolysis temperature were changed as shown in Table 3. In Comparative Examples 1 and 3, the hydrolysis temperature was as

TABLE 1

| | Solvent | | Starting compound | | Conditions for hydrolysis | | |
|---|---|---|---|---|---|---|---|
| Ex. | Name | Amount, ml | Name | Amount, g | Temp., °C. | Ultra-pure water, ml | HCl in molar ratio |
| 1 | xylene | 671 | methyltriethoxysilane | 178.30 (1 mol) | −5 | 170 | 0.05 |
| 2 | diethyl ether | 811 | ethyltriethoxysilane | 192.33 (1 mol) | 0 | 200 | 0.10 |
| 3 | methyl isobutyl ketone | 1014 | ethyltriethoxysilane | 192.33 (1 mol) | 10 | 210 | 0.23 |
| 4 | toluene | 475 | n-propyltriethoxysilane | 206.36 (1 mol) | −10 | 250 | 0.15 |
| 5 | benzene | 1622 1622 | ethyltriethoxysilane | 192.33 (1 mol) | 20 | 150 | 0.20 |
| 6 | methyl isobutyl ketone | 839 | methyltriethoxysilane | 178.30 (1 mol) | 5 | 180 | 0.02 |
| 7 | xylene | 793 | n-propyltriethoxysilane | 206.36 (1 mol) | −15 | 150 | 0.08 |

Note: "HCl in molar ratio" in Table 1 signifies the number of moles of HCl to be added to one mole of the starting compound.

As shown in Table 1, the starting methyltriethoxysilane was used in an amount of 178.30 g (equivalent to 1 mole) in Example 1 and 0.05 mole of hydrogen chloride as dissolved in 170 ml of ultrapure water was added dropwise as a catalyst.

The weight average molecular weights of the silicone ladder prepolymers prepared in Examples 1-7 were measured by a gel permeation chromatographic apparatus (TRI-ROTAR-IV of JOEL, Ltd.); the results are shown in Table 2. The amounts of impurities in the low as −25° C. and the HCl containing ultrapure water solidified upon dropwise addition; hence, hydrolysis did not proceed satisfactorily and the resulting products had very small molecular weights. In Comparative Examples 2 and 4, the hydrolysis temperature was as high as 40° C. and HCl that was added dropwise together with ultrapure water evaporated very rapidly; hence, hydrolysis also did not proceed satisfactorily and the resulting products had very small molecular weights. Consequently, the reaction solutions could not be purified by washing with water and the weight average molecular weights of the polymers could not be measured.

assume one of the values listed under "Content, wt %" in Table 5; the solutions were then stirred thoroughly.

Subsequently, each of the solutions was added dropwise to electronic-grade methyl alcohol in an amount 10 times the volume of addition, whereby the molecular

TABLE 3

| | Solvent | | Starting compound | | Conditions for hydrolysis | | |
|---|---|---|---|---|---|---|---|
| Comp. Ex. | Name | Amount, ml | Name | Amount, g | Temp., °C. | Ultra-pure water, ml | HCl in molar ratio |
| 1 | xylene | 671 | methyl-triethoxy-silane | 178.30 (1 mol) | −25 | 170 | 0.05 |
| 2 | diethyl ether | 811 | ethyl triethoxy-silane | 192.33 (1 mol) | 40 | 200 | 0.10 |
| 3 | methyl isobutyl ketone | 839 | methyl triethoxy-silane | 178.30 (1 mol) | −25 | 180 | 0.02 |
| 4 | xylene | 793 | n-propyl triethoxy-silane | 206.36 (1 mol) | 40 | 150 | 0.08 |

EXAMPLES 8–14

The starting organotrialkoxysilanes listed in Table 4 were mixed with the solvents also listed in Table 4 in the proportions listed in Table 4. The mixtures were subjected to reaction under the conditions shown in Table 4 in accordance with the procedure of Examples 1–7, whereby silicone ladder prepolymer-containing solutions were prepared. Each of these polymer solutions was transferred into a four-neck quartz glass flask having a capacity of 2L that was equipped with a Teflon stirring rod, a Dean-Stark trap and a thermometer. Further, a solution having KOH dissolved in electronic-grade methanol to a concentration of 0.1 mg/ml was put into the flasks as a catalyst under the conditions listed in Table 4 and reaction was carried out under heating for the lengths of time shown in Table 4.

weight of silicone ladder prepolymer was adequately increased. The resulting precipitates of silicone ladder polymer of high molecular weight were recovered.

The recovered precipitates were dried and dissolved again in tetrahydrofuran of the same concentration as used above. The solutions were each added dropwise to 10 volumes of electronic-grade methyl alcohol and the resulting precipitates of silicone ladder polymer of high molecular weight were recovered. This procedure was repeated four times.

The weight average molecular weights of the thus synthesized high-purity silicone ladder polymers of high molecular weight were measured by gel permeation chromatography with TRI-ROTAR-IV of JOEL, Ltd.

The concentrations of impurity ions (Na, K, Fe, Cu and Pb) were measured with an atomic-absorption spec-

TABLE 4

| | Solvent | | Starting compound | | Reaction condition 1 | | | Reaction condition 2 | | |
|---|---|---|---|---|---|---|---|---|---|---|
| Ex. | Name | Amount, ml | Name | Amount, g | Temp., °C. | Ultra-pure water, ml | HCl, mol | Re-agent wt % | Heating time h | Temp., °C. |
| 8 | diethyl ether | 671 | methyl-triethoxy-silane | 178.30 (1 mol) | −5 | 200 | 0.05 | 0.05 | 2 | reflux |
| 9 | methyl isobutyl ketone | 951 | n-propyl-triethoxy-silane | 206.36 (1 mol) | 0 | 180 | 0.08 | 0.10 | 5 | 50 |
| 10 | benzene | 1014 | ethyl-triethoxy-silane | 192.33 (1 mol) | 10 | 150 | 0.15 | 1.00 | 20 | 80 |
| 11 | xylene | 1159 | ethyl-triethoxy-silane | 192.33 (1 mol) | 15 | 150 | 0.10 | 3.00 | 5 | reflux |
| 12 | toluene | 1057 | n-propyl-triethoxy-silane | 206.36 (1 mol) | 25 | 180 | 0.23 | 1.50 | 10 | 70 |
| 13 | methyl isobutyl ketone | 610 | methyl triethoxy-silane | 178.30 (1 mol) | −10 | 240 | 0.02 | 0.01 | 25 | 100 |
| 14 | xylene | 676 | ethyl triethoxy-silane | 192.33 (1 mol) | 0 | 160 | 0.12 | 0.05 | 10 | reflux |

Note 1: The column "Reaction condition 2" describes the conditions for polymerization reaction as initiated by nucleophilic reagent.
Note 2: "Reflux2 under "Temp., °C." means that polymerization was effected at the boiling point of the solvent used.

The reaction solutions that had been heated for the length of time shown in Table 4 were left to cool and, thereafter, purified tetrahydrofuran was added in such amounts that the content of polymer component would troscopic apparatus (IC-500 of Shimadzu Corp.) whereas the concentration of Cl ion was measured with an ion chromatographic analyzer (IC-500 of Yokogama-Hokushin Electric Co., Ltd.). The concentrations of radioactive elements, U and Th, were measured with a fluorescence spectrophotometer (MPF-4 of Hitachi, Ltd.). The results of these measurements are shown in Table 5 below.

TABLE 5

| | | Weight average | Impurity content | | | | | | | |
|---|---|---|---|---|---|---|---|---|---|---|
| | Content, | molecular | ppm | | | | | | ppb | |
| Ex. | wt % | weight | Na | K | Cl | Fe | Cu | Pb | U | Th |
| 8 | 8 | 215000 | 0.98 | 0.65 | 0.51 | ≦0.80 | ≦0.80 | ≦0.80 | ≦1.0 | ≦1.0 |
| 9 | 15 | 896000 | 0.83 | 0.88 | 0.49 | ≦0.80 | ≦0.80 | ≦0.80 | ≦1.0 | ≦1.0 |
| 10 | 5 | 311000 | 0.79 | 0.91 | 0.50 | ≦0.80 | ≦0.80 | ≦0.80 | ≦1.0 | ≦1.0 |
| 11 | 10 | 81000 | 0.91 | 0.78 | 0.52 | ≦0.80 | ≦0.80 | ≦0.80 | ≦1.0 | ≦1.0 |
| 12 | 2 | 152000 | 0.80 | 0.85 | 0.43 | ≦0.80 | ≦0.80 | ≦0.80 | ≦1.0 | ≦1.0 |
| 13 | 8 | 392000 | 0.77 | 0.77 | 0.41 | ≦0.80 | ≦0.80 | ≦0.80 | ≦1.0 | ≦1.0 |
| 14 | 6 | 212000 | 0.85 | 0.96 | 0.45 | ≦0.80 | ≦0.80 | ≦0.80 | ≦1.0 | ≦1.0 |

As one can see from Table 5, there could be produced high-purity silicone ladder polymers of high molecular weight that had less impurity contents. The concentrations of impurity ions decreased with the increase in the number of reprecipitation cycles.

COMPARATIVE EXAMPLES 5-8

Silicone ladder prepolymers were prepared and polycondensed to synthesize silicone ladder polymers of high molecular weight by adopting the same conditions as in Example 4 except that the reaction conditions were changed as listed in Table 6 below. Comparative Examples 5-8 correspond to Examples 8 and 12-14, respectively, shown in Table 4.

degree. Since the silicone ladder prepolymers prepared had only insufficient (low) molecular weights to permit purification by washing with water, KOH was added to the prepolymers as catalyst in one of the amounts listed in Table 6, with those prepolymers remaining unpurified, and condensation reaction was performed by heating for a specified length of time.

The prepolymers polymerized slightly and, hence, they could be purified by washing with water; however, as is clear from the data of analysis shown in Table 7 below, the polymerization products had low molecular weight and their impurity concentrations were high.

TABLE 7

| | | Weight average | Impurity content | | | | | | | |
|---|---|---|---|---|---|---|---|---|---|---|
| | | | ppm | | | | | | ppb | |
| Comp. Ex. | Content, wt % | molecular weight | Na | K | Cl | Fe | Cu | Pb | U | Th |
| 5 | 8 | 3900 | 0.88 | 2.3 | ≦1.50 | ≦0.90 | ≦0.90 | ≦0.90 | ≦1.5 | ≦1.5 |
| 6 | 6 | 3600 | 0.93 | 1.6 | ≦1.50 | ≦0.90 | ≦0.90 | ≦0.90 | ≦1.5 | ≦1.5 |
| 7 | 8 | 4600 | 0.89 | 2.6 | ≦1.50 | ≦0.90 | ≦0.90 | ≦0.90 | ≦1.5 | ≦1.5 |
| 8 | 2 | 4300 | 0.96 | 1.2 | ≦1.50 | ≦0.90 | ≦0.90 | ≦0.90 | ≦1.5 | ≦1.5 |

EXAMPLES 15-21

The various organotrichlorosilanes listed in Table 8 were used as starting materials after being distilled

TABLE 6

| | | | | | Reaction condition 1 | | | Reaction condition 2 | | |
|---|---|---|---|---|---|---|---|---|---|---|
| | Solvent | | Starting compound | | | Ultra-pure water, | HCl, | Re- | | Temp., |
| Comp. Ex. | Name | Amount, ml | Name | Amount, g | Temp., °C. | ml | mol | agent, wt % | Heating time, h | °C. |
| 5 | diethyl ether | 1678 | methyl-triethoxy-silane | 178.30 (1 mol) | −5 | 200 | 0.05 | 0.05 | 2 | reflux |
| 6 | toluene | 1057 | n-propyl-triethoxy-silane | 206.36 (1 mol) | −25 | 180 | 0.23 | 1.50 | 10 | 70 |
| 7 | methyl isobutyl-ketone | 610 | methyl-triethoxy-silane | 178.30 (1 mol) | −25 | 240 | 0.02 | 0.01 | 25 | 100 |
| 8 | xylene | 1803 | ethyl-triethoxy-silane | 192.33 (1 mol) | 0 | 160 | 0.12 | 0.05 | 10 | reflux |

As one can see from Table 6, silicone ladder polymers were produced in Comparative Examples 5 and 8 with the solvents being used in larger amounts than in Examples 8 and 14 (see Table 4). Compared to Examples 12 and 13, the silicone ladder polymers were produced at low temperatures (for reaction condition 1) in Comparative Examples 5 and 8. Thus, when the concentrations of the starting compounds were unduly low or when the temperature of the reaction system was made unduly low at the stage of preparing the silicone ladder prepolymer, it became rather difficult for the molecular weight of the end polymer to increase by a satisfactory under vacuum in a nitrogen stream. These organotrichlorosilanes and the electronic-grade solvents also listed in Table 8 were mixed in the proportions listed in Table 8 to prepare solution. Each of the solution was transferred into a four-neck flask having a capacity of 2 liters that was equipped with a dripping funnel, a thermometer and a stirring rod; the solutions were then cooled at the hydrolysis temperatures listed in Table 8.

Ultrapure water was gradually added dropwise in the amounts listed in Table 8 under the cooling and stirring conditions described above. The resulting heat generation was not very vigorous and the addition was continued for 1–2 h. After the end of the addition, the reaction mixture was stirred for an additional 3 h so as to bring the hydrolyric reaction to completion. Subsequently, the solution of silicone ladder prepolymer was separated into two phases. The lower aqueous layer was removed and the organic layer containing the silicone ladder prepolymer was recovered. An equal volume of ultrapure water was added to the organic layer for washing the latter under shaking. The same procedure was repeated 5 times. The washed silicone ladder prepolymer was analyzed for various impurity contents by an ion chromatographic analyzer (IC-500 of Yokogawa-Hokushin Electric Co., Ltd.); in each of Examples 15–21, the content of chloride ions in the silicone ladder prepolymer was ca. 1,000 ppm after the first washing and it was 1 ppm and less in the third and subsequent washing cycles; the concentration of potassium ions also decreased as the number of washing cycles increased and it was 1 ppm and below in the third and subsequent washing cycles.

rine was 1 ppm or less whereas the content of each of uranium and thorium was 1 ppb or less.

Further, the structures of the respective silicone ladder prepolymers produced in Examples 15–21 were examined by infrared spectrophotometry (using FT/IR-111 of JOEL, Ltd.); since a double peak for siloxane bond was observed at near 1100 cm$^{-1}$ (see Journal of Polymer Science, Vol. C-1, p.83), each of the silicone ladder prepolymers tested was verified to have the structure represented by the general formula (I).

COMPARATIVE EXAMPLES 9–12

The organotrichlorosilanes listed in Table 8 were hydrolyzed as in Examples 15–21 except that the proportion of mixing the starting organotrichlorosilanes with electronic-grade solvents and the hydrolysis temperature were changed as shown in Table 8. In Comparative Examples 9 and 11, the hydrolysis temperature was as low as −25° C. and the ultrapure water solidified upon dropwise addition; hence, hydrolysis did not proceed satisfactorily and the resulting products had very

TABLE 8

| | Solvent | | Starting Compound | | Conditions for hydrolysis | |
|---|---|---|---|---|---|---|
| | Name | Amount, ml | Name | Amount, g | Temp., °C. | Ultra-pure water, ml |
| Ex. | | | | | | |
| 15 | xylene | 839 | methyl-trichloro-silane | 149.48 (1 mol) | 0 | 150 |
| 16 | diethyl ether | 811 | ethyl-trichloro-silane | 163.51 (1 mol) | −5 | 180 |
| 17 | benzene | 1159 | ethyl-trichloro-silane | 163.51 (1 mol) | 20 | 200 |
| 18 | toluene | 793 | n-propyl-trichloro-silane | 177.53 (1 mol) | −10 | 230 |
| 19 | methyl isobutyl ketone | 405 | ethyl-trichloro-silane | 163.51 (1 mol) | 15 | 150 |
| 20 | methyl isobutyl ketone | 1342 | methyl-trichloro-silane | 149.48 (1 mol) | −15 | 170 |
| 21 | xylene | 951 | n-propyl-trichloro-silane | 177.53 (1 mol) | −10 | 160 |
| Comp. Ex. | | | | | | |
| 9 | xylene | 202 | ethyl-trychloro-silane | 163.51 (1 mol) | −25 | 150 |
| 10 | toluene | 1119 | methyl-trychloro-silane | 149.48 (1 mol) | 40 | 150 |
| 11 | diethyl ether | 237 | n-propyl-trychloro-silane | 177.53 (1 mol) | −25 | 150 |
| 12 | toluene | 1352 | ethyl-trychloro-silane | 163.51 (1 mol) | 40 | 150 |

In the next place, the weight average molecular weights of the silicone ladder prepolymers prepared in Examples 15–21 were measured by a gel permeation chromatographic apparatus (TRI-ROTAR-IV of JOEL, Ltd.); the results are shown in Table 9. The amounts of impurities in the respective silicone ladder prepolymers after three washing cycles are also shown in Table 9, from which one can see that the content of each of sodium, potassium, iron, copper, lead and chlosmall molecular weights. In Comparative Examples 10 and 12, the hydrolysis temperature was as high as 40° C. and HCl that was added dropwise together with ultrapure water evaporated very rapidly; hence, hydrolysis also did not proceed satisfactorily and the resulting products had very small molecular weights. Consequently, the reaction solutions could not be purified by washing with water. The results of Comparative Examples 9–12 are also shown in Table 9 together with the results of Comparative Examples 15–21.

TABLE 9

| | Concentration in solvent, g/ml | Weight average molecular weight | Impurity content ppm | | | | | | ppb | |
|---|---|---|---|---|---|---|---|---|---|---|
| | | | Na | K | Cl | Fe | Cu | Pb | U | Th |
| Ex. | | | | | | | | | | |
| 15 | 0.08 | 11500 | 0.92 | 0.83 | 0.51 | ≦0.80 | ≦0.80 | ≦0.80 | ≦1.0 | ≦1.0 |
| 16 | 0.10 | 9500 | 0.94 | 0.86 | 0.48 | ≦0.80 | ≦0.80 | ≦0.80 | ≦1.0 | ≦1.0 |
| 17 | 0.07 | 13500 | 0.85 | 0.78 | 0.46 | ≦0.80 | ≦0.80 | ≦0.80 | ≦1.0 | ≦1.0 |
| 18 | 0.12 | 14300 | 0.82 | 0.79 | 0.53 | ≦0.80 | ≦0.80 | ≦0.80 | ≦1.0 | ≦1.0 |
| 19 | 0.20 | 8600 | 0.67 | 0.88 | 0.47 | ≦0.80 | ≦0.80 | ≦0.80 | ≦1.0 | ≦1.0 |
| 20 | 0.05 | 11800 | 0.78 | 0.84 | 0.52 | ≦0.80 | ≦0.80 | ≦0.80 | ≦1.0 | ≦1.0 |
| 21 | 0.10 | 12100 | 0.96 | 0.92 | 0.46 | ≦0.80 | ≦0.80 | ≦0.80 | ≦1.0 | ≦1.0 |
| Comp. Ex. | | | | | | | | | | |
| 9 | 0.40 | No progress of hydrolysis | — | — | — | — | — | — | — | — |
| 10 | 0.06 | No progress of hydrolysis | — | — | — | — | — | — | — | — |
| 11 | 0.40 | No progress of hydrolysis | — | — | — | — | — | — | — | — |
| 12 | 0.06 | No progress of hydrolysis | — | — | — | — | — | — | — | — |

EXAMPLES 22–28

High-purity silicone ladder prepolymers were synthesized in accordance with the procedure of Examples 15–21 using solvents and starting compounds (see Table 10) as they were mixed in the amounts also listed in Table 10. Solutions containing these prepolymers were transferred into four-neck quartz glass flask each having a capacity of 2L that were equipped with a Teflon stirring rod, a Dean-Stark trap and a thermometer. Further, a solution having KOH dissolved in electronic-grade methanol to a concentration of 0.1 g/ml was put into the flasks as a nucleophilic reagent at the weight ratios listed in Table 10 and dehydrative condensation reaction was carried out under heating for the lengths of time shown in Table 10.

The reaction solutions were heated for a predetermined time and left to cool. Thereafter, purified tetrahydrofuran was added as a good solvent in such amounts that the content of polymer component would assume one of the values listed in Table 11. A complete solution was formed by through agitation of each mixture and added dropwise to 10 volumes of electronic-grade methyl alcohol as a poor solvent. The resulting precipitates of high-purity silicone ladder polymer of high molecular weight were recovered. The recovered precipitates were dried and dissolved again in tetrahydrofuran of the same concentration as used above. By subsequent precipitation in the same manner, silicone ladder polymers of high molecular weight were recovered. This procedure was repeated four times.

The weight average molecular weights of the thus produced high-purity silicone ladder polymers of high molecular weight were measured by gel permeation chromatography with TRI-ROTAR-IV of JOEL, Ltd. The concentrations of sodium, potassium, iron, copper and lead ions in those polymers were measured with an atomic-absorption spectroscopic apparatus (IC-500 of Shimadzu Corp.) whereas the concentration of chloride ion was measured with an ion chromatographic analyzer (IC-500 of Yokogawa-Hokushin Electric Co., Ltd.). The concentrations of radioactive elements, uranium and thorium, were measured with a fluorescence spectrophotometer (MPF-4 of Hitachi, Ltd.). The results are shown in Table 11. The concentrations of impurity ions decreased with the increase in the number of reprecipitation cycles.

COMPARATIVE EXAMPLES 13–16

The organotrialkoxysilanes listed in Table 10 were hydrolyzed in accordance with the procedure of Comparative Examples 9–12. Since the resulting hydrolyzates had only insufficient (low) molecular weights to permit purification by washing with water, KOH was added to the hydrolyzates as a nucleophilic reagent in one of the amounts listed in Table 10, with those hydrolyzates remaining unpurified, and dehydrative condensation reaction was performed by heating for a specified length of time. The hydrolyzates polymerized slightly and, hence, they could be purified by washing with water; however, as is clear from Table 11, the polymerization products had high impurity concentrations.

TABLE 10

| | Solvent | | Starting compound | | Conditions for hydrolysis | | Conditions for dehydrative condensation reaction | | |
|---|---|---|---|---|---|---|---|---|---|
| | Name | Amount, ml | Name | Amount, g | Temp., °C. | Ultra-pure water, ml | Nucleo-philic reagent/pre-polymer | Heating time, h | Temp., °C. |
| Ex. | | | | | | | | | |
| 22 | toluene | 951 | n-propyl-trichloro-silane | 177.53 (1 mol) | 10 | 180 | 0.10 | 5 | 100 |
| 23 | xylene | 559 | methyl-trichloro-silane | 149.48 (1 mol) | 0 | 200 | 0.05 | 20 | 80 |
| 24 | diethyl ether | 1622 | ethyl-trichloro-silane | 163.51 (1 mol) | −5 | 220 | 3.00 | 2 | reflux |
| 25 | methyl-isobutyl | 838 | methyl-trichloro- | 149.48 (1 mol) | −10 | 160 | 1.00 | 10 | 100 |

TABLE 10-continued

| | Solvent | | Starting compound | | Conditions for hydrolysis | | Conditions for dehydrative condensation reaction | | |
|---|---|---|---|---|---|---|---|---|---|
| | Name | Amount, ml | Name | Amount, g | Temp., °C. | Ultra-pure water, ml | Nucleo-philic reagent/pre-polymer | Heating time, h | Temp., °C. |
| 26 | ketone xylene | 1359 | silane n-propyl-trichloro-silane | 177.53 (1 mol) | 25 | 180 | 2.50 | 25 | 120 |
| 27 | toluene | 405 | ethyl-trichloro-silane | 163.51 (1 mol) | 0 | 210 | 0.05 | 20 | 100 |
| 28 | methyl-isobutyl ketone | 671 | methyl-trichloro-silane | 149.48 (1 mol) | 10 | 170 | 0.01 | 15 | reflux |
| Comp. Ex. | | | | | | | | | |
| 13 | diethyl ether | 671 | methyl-trichloro-silane | 149.48 (1 mol) | −25 | 160 | 0.02 | 5 | reflux |
| 14 | toluene | 1057 | n-propyl-trichloro-silane | 177.53 (1 mol) | 40 | 170 | 5.50 | 20 | reflux |
| 15 | toluene | 1342 | methyl-trichloro-silane | 149.48 (1 mol) | −30 | 170 | 6.50 | 10 | 50 |
| 16 | benzene | 1352 | ethyl-trichloro-silane | 163.51 (1 mol) | 40 | 180 | 0.02 | 15 | reflux |

TABLE 11

| | Polymer content in good solvent, wt % | Weight average molecular weight | Impurity content | | | | | | | |
|---|---|---|---|---|---|---|---|---|---|---|
| | | | ppm | | | | | | ppb | |
| | | | Na | K | Cl | Fe | Cu | Pb | U | Th |
| Ex. | | | | | | | | | | |
| 22 | 7 | 389000 | 0.84 | 0.78 | 0.50 | ≦0.80 | ≦0.80 | ≦0.80 | ≦1.0 | ≦1.0 |
| 23 | 15 | 822000 | 0.89 | 0.81 | 0.48 | ≦0.80 | ≦0.80 | ≦0.80 | ≦1.0 | ≦1.0 |
| 24 | 8 | 169000 | 0.97 | 0.92 | 0.48 | ≦0.80 | ≦0.80 | ≦0.80 | ≦1.0 | ≦1.0 |
| 25 | 10 | 364000 | 0.92 | 0.96 | 0.51 | ≦0.80 | ≦0.80 | ≦0.80 | ≦1.0 | ≦1.0 |
| 26 | 2 | 186000 | 0.77 | 0.81 | 0.45 | ≦0.80 | ≦0.80 | ≦0.80 | ≦1.0 | ≦1.0 |
| 27 | 8 | 89000 | 0.86 | 0.76 | 0.40 | ≦0.80 | ≦0.80 | ≦0.80 | ≦1.0 | ≦1.0 |
| 28 | 12 | 517000 | 0.84 | 0.92 | 0.41 | ≦0.80 | ≦0.80 | ≦0.80 | ≦1.0 | ≦1.0 |
| Comp. Ex. | | | | | | | | | | |
| 13 | 8 | 3900 | 0.89 | 1.3 | ≦1.50 | ≦0.90 | ≦0.90 | ≦0.90 | ≦1.5 | ≦1.5 |
| 14 | 8 | 4300 | 0.93 | 1.6 | ≦1.50 | ≦0.90 | ≦0.90 | ≦0.90 | ≦1.5 | ≦1.5 |
| 15 | 8 | 2600 | 0.83 | 2.7 | ≦1.50 | ≦0.90 | ≦0.90 | ≦0.90 | ≦1.5 | ≦1.5 |
| 16 | 8 | 3500 | 0.85 | 2.6 | ≦1.50 | ≦0.90 | ≦0.90 | ≦0.90 | ≦1.5 | ≦1.5 |

The data in Tables 8–11 demonstrate the successful preparation of high-purity silicone ladder prepolymers and silicone ladder polymers of high molecular weight that contain very small amounts of impurities such as sodium, potassium, chlorine, iron, copper, uranium and thorium, and which have a terminal hydroxyl group.

As described on the foregoing pages, the present invention enables the production of silicone ladder polymers of high molecular weight, from which films thick enough to be used as protective or inter-level insulation films in semiconductor devices can be easily formed. Take, for examples, conventional silicone ladder polymers whose molecular weights are on the order of $10^4$ at maximum; when solutions of these polymers adjusted to a resin concentration of 20 wt % are spin-coated at 3000 rpm, the film thickness that can be attained has been no more than 2 μm. In contract, the silicone ladder polymers produced in the examples of the present invention have molecular weights in excess of $10^5$ and films having a thickness of 5 μm or more can be formed by spin coating under the same conditions as set forth above.

To summarize the advantages of the present invention: it is capable of providing very pure silicone ladder polymers; such high-purity silicone ladder polymers can be easily produced; high-purity and high-molecular weight silicone ladder polymers which are produced by dehydrative condensation reaction have weight average molecular weights of about $10^5$ and more and, hence, they can advantageously be used as materials for the making of surface protective and inter-level insulation films in semiconductor devices.

What is claimed is:

1. A high-purity silicone ladder polymer that contains no more than 1 ppm each of sodium, potassium, iron, copper, lead and chlorine and no more than 1 ppb each of uranium and thorium, that is represented by general formula (I):

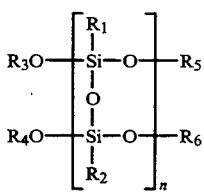

(I)

where $R_1$ and $R_2$ represent the same or different lower alkyl groups; $R_3$, $R_4$, $R_5$ and $R_6$ each represent a hydrogen atom or a lower alkyl group; and n is an integer corresponding to a weight average molecular weight of 600–1,000,000, and that has a molecular weight distribution of no more than 10.

2. A process for producing a high-purity silicone ladder prepolymer that has a terminal alkoxy group and a molecular weight distribution of no more than 10, that contains no more than 1 ppm each of sodium, potassium, iron, copper, lead and chlorine and no more than 1 ppb each of uranium and thorium, and that is represented by the general formula (I):

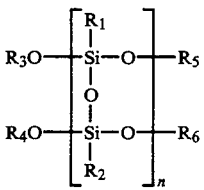

(I)

where $R_1$ and $R_2$ represent the same or different lower alkyl groups; $R_3$, $R_4$, $R_5$ and $R_6$ represent a hydrogen atom or a lower alkyl group; and n is an integer corresponding to a weight average molecular weight of 600 to less than 30,000; which process comprises dissolving an organotrialkoxysilane compound of the general formula (II):

$$R_7SiOR_8OR_9OR_{10}$$

where $R_7$, $R_8$, $R_9$ and $R_{10}$ each represent a lower alkyl group, in an organic solvent, hydrolyzing said compound with hydrogen chloride containing ultrapure water having a specific resistance of about 16 MΩ·cm or above, under cooling, and then washing the resulting hydrolyzate with ultrapure water.

3. A process for producing a high-purity silicone ladder prepolymer that has a terminal hydroxyl group and a molecular weight distribution of no more than 10, that contains no more than 1 ppm each of sodium, potassium, iron, copper, lead and chlorine and no more than 1 ppb each of uranium and thorium, and that is represented by the general formula (I):

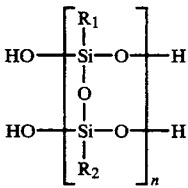

(I)

where $R_1$ and $R_2$ represent the same or different lower alkyl groups; and n is an integer corresponding to a weight average molecular weight of 600 to less than 30,000, which process comprises dissolving an organotrichlorosilane compound of the general formula (III):

$$R_{11}SiCl_3$$

where $R_{11}$ represents a lower alkyl group, in an organic solvent, hydrolyzing said compound with ultrapure water having a specific resistance of about 16 MΩ·cm or above, under cooling, and then washing the resulting hydrolyzate with ultrapure water.

4. A process for producing a high-purity silicone ladder polymer of high molecular weight that contains no more than 1 ppm each of sodium, potassium, iron, copper, lead and chlorine and no more than 1 ppb each of uranium and thorium, and that has a weight average molecular weight of 30,000–1,000,000, which process comprises dissolving the high-purity silicone ladder prepolymer of claim 2 or 3 in an organic solvent to form a solution, then adding a nucleophilic reagent to said solution to initiate dehydrative condensation to yield a product having a higher molecular weight than the silicone ladder prepolymer of claim 2 or 3, and purifying said product by a dissolution/reprecipitation method.

5. The silicone ladder polymer of claim 1 wherein n is an integer corresponding to a weight average molecular weight of 600 to less than 30,000.

6. The silicone ladder polymer of claim 1 wherein n is an integer corresponding to a weight average molecular weight of 30,000 to 1,000,000.

7. The silicone ladder polymer of claim 1 wherein n is an integer corresponding to a weight average molecular weight of greater than 3,900 to less than 30,000.

8. The silicone ladder polymer of claim 1 wherein n is an integer corresponding to a weight average molecular weight of greater than 200,000 to 1,000,000.

9. The silicone ladder polymer of claim 1 wherein n is an integer corresponding to a weight average molecular weight of greater than 300,000 to 1,000,000.

10. The silicone ladder polymer of claim 1 wherein n is an integer corresponding to a weight average molecular weight of greater than 400,000 to 1,000,000.

11. The silicone ladder polymer of claim 1, having an infrared spectrophotometry banding pattern comprising a double peak in the vicinity of 1100 cm$^{-1}$ which is characteristic of a ladder type linkage of siloxane and substantially no single peak at 1100 cm$^{-1}$ which is characteristic of a linear type linkage of siloxane.

12. The process of claim 2 wherein the silicone ladder prepolymer has a weight average molecular weight of 3,900 to less than 30,000.

13. The process of claim 4 wherein the silicone ladder polymer has a weight average molecular weight of greater than 200,000 to 1,000,000.

14. The process of claim 4 wherein the silicone ladder polymer has a weight average molecular weight of greater than 300,000 to 1,000,000.

15. The process of claim 4 wherein the silicone ladder polymer has a weight average molecular weight of greater than 400,000 to 1,000,000.

16. The process of claim 4 wherein the silicone ladder polymer has an infrared spectrophotometry banding pattern comprising a double peak in the vicinity of 1100 cm$^{-1}$ which is characteristic of a ladder type linkage of siloxane and substantially no single peak at 1100 cm$^{-1}$ which is characteristic of a linear type linkage of siloxane.

* * * * *